US011901416B2

United States Patent
Tsunoda (10) Patent No.: US 11,901,416 B2
(45) Date of Patent: Feb. 13, 2024

(54) SEMICONDUCTOR DEVICE (71) Applicant: Mitsubishi Electric Corporation, Tokyo (JP)

(72) Inventor: Tetsujiro Tsunoda, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 417 days.

(21) Appl. No.: 17/418,511

(22) PCT Filed: Apr. 10, 2019

(86) PCT No.: PCT/JP2019/015600
§ 371 (c)(1),
(2) Date: Jun. 25, 2021

(87) PCT Pub. No.: WO2020/208738
PCT Pub. Date: Oct. 15, 2020

(65) Prior Publication Data
US 2022/0069086 A1 Mar. 3, 2022

(51) Int. Cl.
*H01L 29/10* (2006.01)
*H01L 29/32* (2006.01)
*H01L 29/739* (2006.01)

(52) U.S. Cl.
CPC .......... *H01L 29/1095* (2013.01); *H01L 29/32* (2013.01); *H01L 29/7397* (2013.01)

(58) Field of Classification Search
CPC . H01L 29/1095; H01L 29/32; H01L 29/7397; H01L 29/083; H01L 29/0696; H01L 29/78
See application file for complete search history.

(56) References Cited

U.S. PATENT DOCUMENTS

| | | | | |
|---|---|---|---|---|
| 11,101,187 | B2* | 8/2021 | Takaoka | H01L 29/7813 |
| 2015/0179758 | A1 | 6/2015 | Ata | |
| 2015/0221566 | A1* | 8/2015 | Ookura | H01L 22/14 |
| | | | | 257/48 |
| 2019/0181252 | A1* | 6/2019 | Shirakawa | H01L 29/407 |
| 2019/0341483 | A1* | 11/2019 | Harada | G01R 19/10 |
| 2021/0082912 | A1* | 3/2021 | Shirakawa | H01L 29/4236 |

FOREIGN PATENT DOCUMENTS

WO    2014/013618 A1    1/2014

OTHER PUBLICATIONS

International Search Report issued in PCT/JP2019/015600; dated Jul. 16, 2019.

* cited by examiner

*Primary Examiner* — J. E. Schoenholtz
(74) *Attorney, Agent, or Firm* — Studebaker & Brackett PC (57) ABSTRACT

An object is to provide a technique capable of suppressing the rise in the sense voltage during the Miller plateau. A semiconductor device includes a semiconductor substrate of first conductivity type, a first IGBT portion and a second IGBT portion selectively disposed on a first main surface of the semiconductor substrate, and an impurity region of second conductivity type selectively disposed on a second main surface of the semiconductor substrate. The second IGBT portion is used to detect the current passing through the first IGBT portion. An area ratio of the impurity region within a second range to an area of the second range is lower than an area ratio of the impurity region within a first range to an area of the first range, the second range corresponding to the second IGBT portion, the first range corresponding to the first IGBT portion.

5 Claims, 8 Drawing Sheets

SEMICONDUCTOR DEVICE

TECHNICAL FIELD

The present invention relates to a semiconductor device having a built-in current detection element.

BACKGROUND ART

An Insulated Gate Bipolar Transistor (IGBT) with a built-in current detection element has been proposed. In the IGBT with a built-in current detection element, the measurement of a sense voltage in accordance with a sense current flowing from the current detection element enables the detection of the current passing through the main-side IGBT.

In a circuit including such an IGBT with a built-in current detection element and an inductive load, a phenomenon occurs in which the sense voltage sharply rises during the Miller plateau at the time of switching of the IGBT. Such a phenomenon may lead to a malfunction of the circuit. Therefore, various techniques (for example, Patent Document 1) have been proposed to solve this problem.

PRIOR ART DOCUMENTS

Patent Documents

[Patent Document 1] International Publication No. 2014/013618

SUMMARY

Problem to be Solved by the Invention

In the technique of Patent Document 1, the threshold voltage of the current detection element is made larger than that of the main-side IGBT. However, there has been a problem that the application of such a configuration to an element having a low on-voltage and moreover a threshold voltage, which has been widely used in recent years is difficult.

The present invention has been made in view of the above problem and has an object to provide a technique capable of suppressing the rise in the sense voltage during the Miller plateau.

Means to Solve the Problem

According to the present invention, the semiconductor device includes a semiconductor substrate of first conductivity type, a first IGBT portion selectively disposed on a first main surface of the semiconductor substrate, a second IGBT portion disposed on the first main surface of the semiconductor substrate, spaced from the first IGBT, and used for detection of a current passing through the first IGBT portion, and an impurity region of second conductivity type selectively disposed on a second main surface opposite to the first main surface of the semiconductor substrate, in which an area ratio of the impurity region within a second range to an area of the second range is lower than an area ratio of the impurity region within a first range to an area of the first range, the second range corresponding to the second IGBT portion on the second main surface, the first range corresponding to the first IGBT portion on the second main surface.

Effects of the Invention

According to the present invention, the area ratio of the impurity region within the second range to an area of the second range is lower than the area ratio of the impurity region within the first range to an area of the first range, the second range corresponding to the second IGBT portion, the first range corresponding to the first IGBT portion. According to such a configuration, the suppression of the rise in the sense voltage during the Miller plateau is ensured.

The objects, characteristics, aspects, and advantages of the technique disclosed in the present specification will become more apparent from the following detailed description and the accompanying drawings.

DESCRIPTION OF EMBODIMENT(S)

<Related Semiconductor Device>

First, before describing the semiconductor device according to Embodiments of the present invention, a semiconductor device related thereto (hereinafter referred to as "related semiconductor device") will be described. Hereinafter, the configuration in which a first conductive type is n-type and a second conductive type is p-type will be described as an example. However, the present invention is not limited thereto, and the first conductive type may be p-type and the second conductive type may be n-type.

Figure 1:
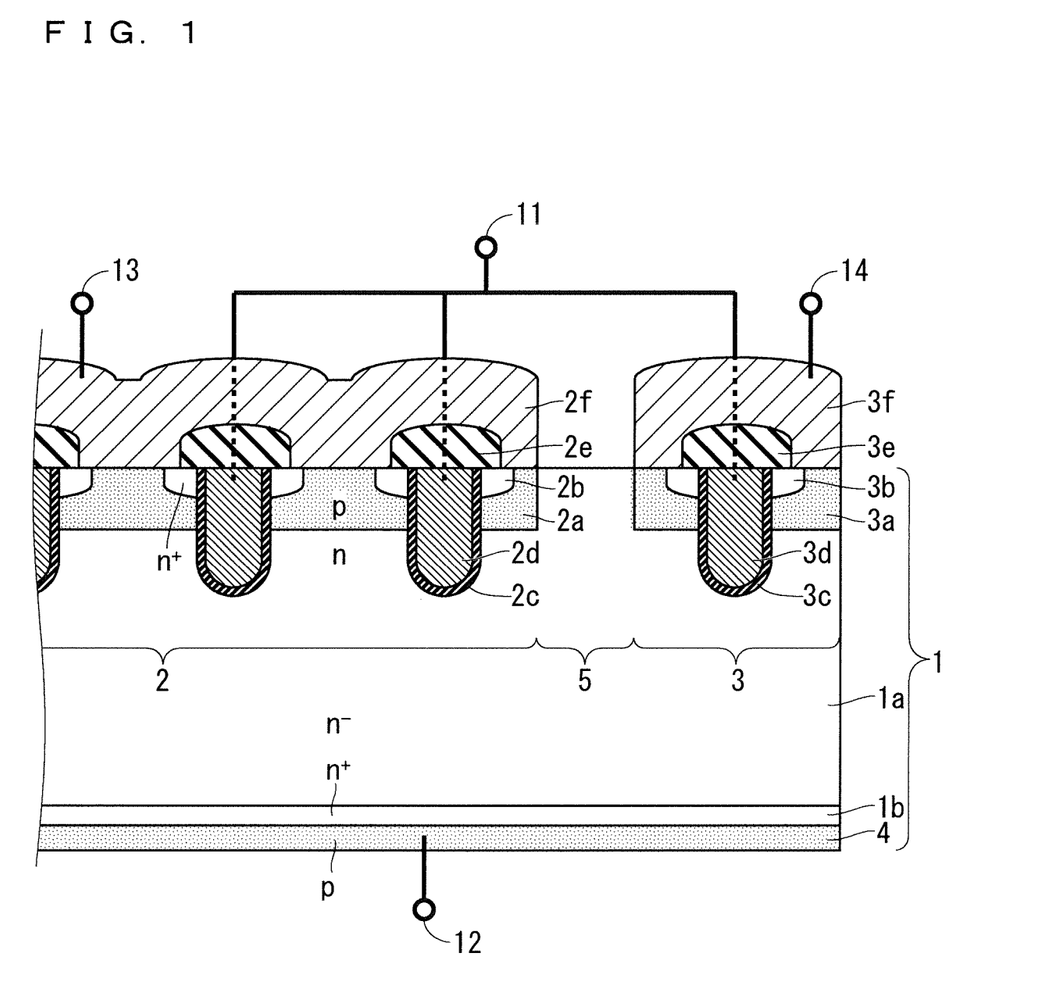
FIG. 1 A cross-sectional view illustrating the configuration of a related semiconductor device.

FIG. 1 is a cross-sectional view illustrating a configuration of the related semiconductor device. The related semiconductor device of FIG. 1 includes a semiconductor substrate 1, a main IGBT portion 2 being a first IGBT portion, a sense IGBT portion 3 being a second IGBT portion, and a collector region 4 being a p-type impurity region.

The semiconductor substrate has an n-type property. The semiconductor substrate 1 includes a drift region 1a having an n-type property and an n--type property in this order from the upper surface (first main surface), and a buffer region 1b having n+ type property. The buffer region 1b is disposed below the drift region 1a. The configuration of the semiconductor substrate 1 is not limited to the above configuration. Further, the semiconductor substrate 1 may be composed of a typical semiconductor wafer or an epitaxial growth layer.

The main IGBT portion 2 is selectively disposed on the upper surface of the drift region 1a of the semiconductor substrate 1. The main IGBT portion 2 includes a p-type base region 2a, an n+ type emitter region 2b, a gate insulating film 2c, a gate electrode 2d, an interlayer insulating film 2e, and an emitter electrode 2f. The main IGBT portion 2, the drift region 1a, the buffer region 1b, and the collector region 4 compose the main-side IGBT.

The base region 2a is selectively disposed on the upper surface of the drift region 1a. The emitter region 2b is selectively disposed on the upper surface of the base region 2a. The gate electrode 2d is disposed in a trench extending through the base region 2a, the emitter region 2b, and the drift region 1a, via the gate insulating film 2c.

The interlayer insulating film 2e is disposed on the gate insulating film 2c, the gate electrode 2d, and a part of the emitter region 2b. The emitter electrode 2f is connected to the base region 2a and the emitter region 2b exposed from the interlayer insulating film 2e.

The sense IGBT portion 3 is disposed on the upper surface of the drift region 1a of the semiconductor substrate 1 and is spaced from the main IGBT portion 2. In the following description, the description is made with the portion between the main IGBT portion 2 and the sense IGBT portion 3 denoted as a separation portion 5.

One sense IGBT portion 3 has substantially the same design and configuration as one main IGBT portion 2. That is, the sense IGBT portion 3 includes a base region 3a, an emitter region 3b, a gate insulating film 3c, a gate electrode 3d, an interlayer insulating film 3e, and an emitter electrode 3f which are similar, respectively, to the base region 2a, the emitter region 2b, the gate insulating film 2c, the gate electrode 2d, the interlayer insulating film 2e, and the emitter electrode 2f. The base region 2a and the base region 3a are potentially separated from each other by the separation portion 5. The sense IGBT portion 3 configured as described above is formed at the same time by, for example, the same process as the main IGBT portion 2.

The sense IGBT portion 3, the drift region 1a, the buffer region 1b, and the collector region 4 compose a sense-side IGBT being a current detection element. This sense-side IGBT is used to detect the current passing through the main-side IGBT described above. That is, the sense IGBT portion 3 is used to detect the current passing through the main IGBT portion 2.

The number of sense-side IGBTs is smaller than the number of main-side IGBTs, and the number of sense-side IGBTs for the required area is disposed. The sense-side IGBT only needs to output a small current required for current detection; therefore, typically, the sense-side IGBTs are disposed at a ratio of about 1 to 1000 to tens of thousands of main-side IGBTs. In FIG. 1, although the number of sense-side IGBTs is one, a plurality of sense-side IGBTs connected in parallel may be disposed.

The collector region 4 is disposed on the whole surface of the buffer region 1b opposite to the drift region 1a. That is, the collector region 4 is disposed on the whole lower surface (second main surface) opposite to the upper surface of the semiconductor substrate 1. Holes are injected from the collector region 4 through the buffer region 1b into the drift region 1a, and a conductivity modulation effect is generated to enhance the current conduction capacity. A collector electrode (not illustrated) may be disposed on the collector region 4.

A gate terminal 11 is connected to the gate electrode 2d and the gate electrode 3d, and a collector terminal 12 is electrically connected to the collector region 4. An emitter terminal 13 is connected to the emitter electrode 2f, and a sense emitter terminal 14 is connected to the emitter electrode 3f.

Now, in the main-side IGBT, when an on-voltage is applied to the gate electrode 2d, a channel through which a current flows between the collector region 4 and the emitter electrode 2f is formed in the portion of the base region 2a near the gate electrode 2d. The same also applies to the sense-side IGBT. As described above, one main-side IGBT and one sense-side IGBT have substantially the same design and configuration, and are connected to the same gate terminal 11. Therefore, by detecting the current flowing through one sense-side IGBT, the calculation (estimation) of the current flowing through one main-side IGBT, and moreover, a plurality of main-side IGBTs is ensured.

Figure 2:
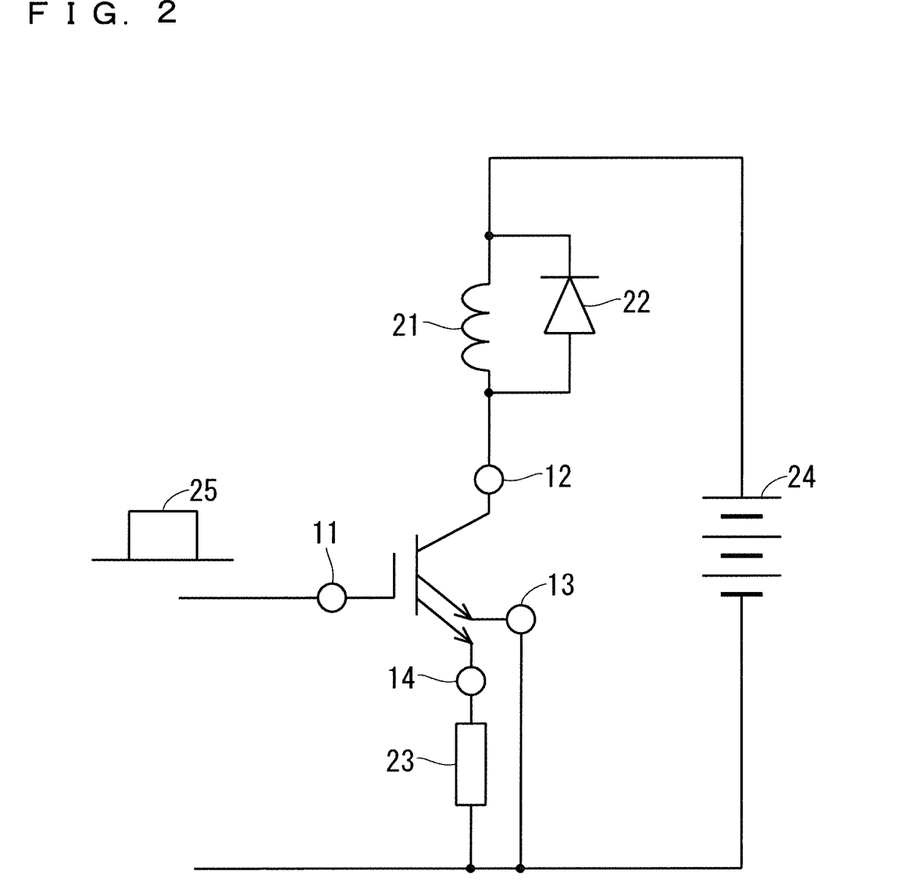
FIG. 2 A diagram illustrating a circuit example having the related semiconductor device and an inductive load.

FIG. 2 is a diagram illustrating a circuit example having the related semiconductor device and an inductive load such as an inductance 21. The collector terminal 12 is connected to one end of the inductance 21 and a diode 22, and the other end of the inductance 21 and the diode 22 is connected to one end of the power source 24. The sense emitter terminal 14 is connected to the emitter terminal 13 and the other end of the power source 24 via a sense resistor 23.

In such a circuit of FIG. 2, the current flowing through the sense-side IGBT, that is, the output current of the sense emitter terminal 14, flows through the sense resistor 23. As a result, a sense voltage is generated in the sense resistor 23. The calculation of the passing current of the sense-side IGBT is ensured from the sense voltage, and the calculation of the passing current of the main-side IGBT is ensured from the passing current of the sense-side IGBT. The sense voltage, the passing current of the sense-side IGBT, or the passing current of the main-side IGBT are used for protection operations such as overcurrent protection and short-circuit current protection of the main-side IGBT, for example.

Figure 3:
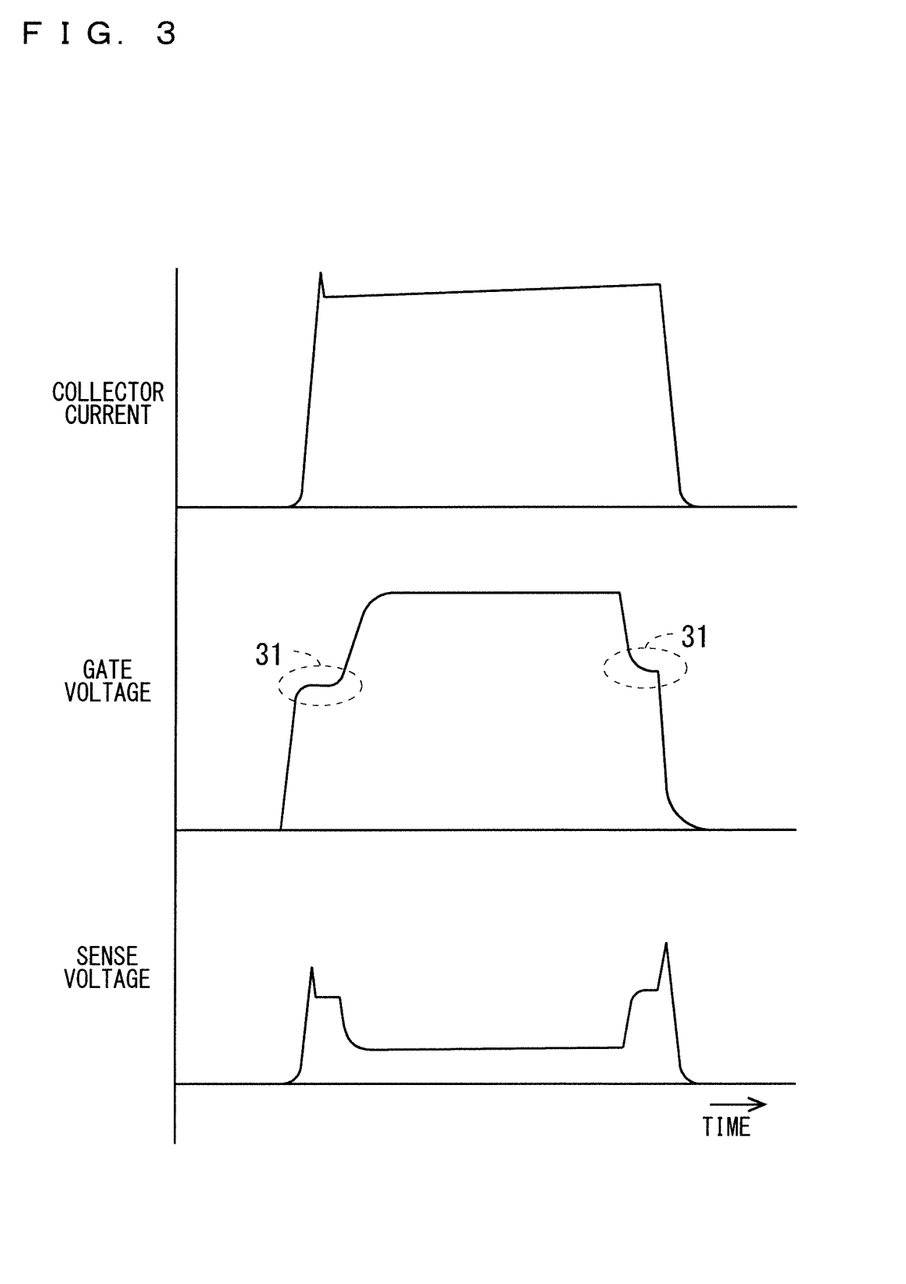
FIG. 3 A diagram illustrating respective changes in a collector current, a gate voltage, and a sense voltage at the time of switching of the related semiconductor device.

Now, in a circuit including the related semiconductor device and the inductive load as illustrated in FIG. 2, a phenomenon has been known in which the sense voltage rises during the Miller plateau at the time of switching of the related semiconductor device. FIG. 3 is a diagram illustrating respective changes in the collector current, the gate voltage, and the sense voltage at the time of switching of the related semiconductor device when a signal of the square wave 25 in FIG. 2 is input to the gate terminal 11.

When the sense voltage is generated, the potential of the sense emitter terminal 14 rises and the collector-emitter voltage of the sense-side IGBT decreases, so that the current of the sense-side IGBT is suppressed. However, during the Miller plateau, the influence of the potential rise in the sense emitter terminal 14 becomes smaller due to the rise in the collector voltage, so that it is observed as a phenomenon of a sharp rise in the sense voltage. Such a phenomenon may lead to a malfunction of the circuit.

Therefore, as a configuration for solving this problem, a configuration is conceivable in which an external circuit for filtering or masking the sense voltage generated during the Miller plateau is provided. However, in such a configuration, the protection operation may have been unperformable for a certain period of time due to the influence of the masking or the like.

Further, as another configuration for solving the above problem, a configuration is conceivable in which the threshold voltage of the sense-side IGBT is made larger than that of the main-side IGBT. However, in this configuration, a significant change in the threshold voltage itself is not made without changing the manufacturing process. Further, even if a substantial change in the manufacturing process is made and the significant change in the threshold voltage is made, the improvement effect may have varied depending on the gate driving conditions used by the user.

Furthermore, in high-performance IGBTs with low on-voltage, which have been widely used in recent years, there is a significant effect of the potential rise in the sense emitter terminal due to the generation of the sense voltage, and there has been a problem in that the degree of the rise in the sense voltage tends to be large during the Miller plateau during which this effect is mitigated. Whereas, the semiconductor device according to Embodiments of the present invention described below will solve such a problem.

Embodiment 1

Figure 4:
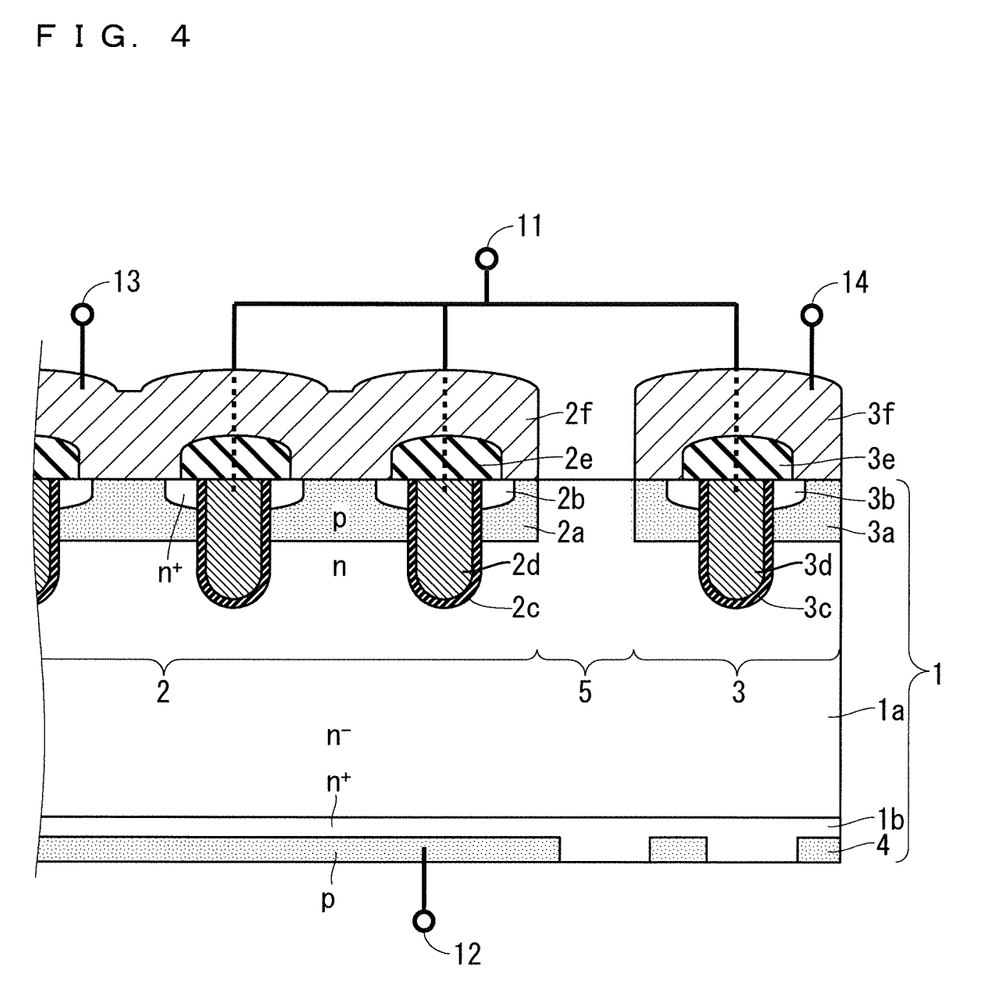
FIG. 4 A cross-sectional view illustrating a configuration of a semiconductor device according to Embodiment 1.

FIG. 4 is a cross-sectional view illustrating a configuration of a semiconductor device according to Embodiment 1 of the present invention. Hereinafter, of the components according to Embodiment 1, the same or similar reference numerals are given to the same or similar components as those described above, and different components will be mainly described.

In Embodiment 1, the collector region 4 is selectively disposed on the lower surface (second main surface) of the semiconductor substrate 1. The area ratio of the collector region 4 within the sense range to the area of the sense range (second range) is lower than the area ratio of the collector region 4 within the main range to the area of the main range (first range), the sense range corresponding to the sense IGBT portion 3 on the lower surface of the semiconductor substrate 1, the main range corresponding to the main IGBT portion 2 on the lower surface of the semiconductor substrate 1. Here, the area ratio of the collector region 4 represents the ratio of the collector region 4 to the total area in each of the main range and the sense range. The area ratio of the collector region 4 within the sense range being lower than the area ratio of the collector region 4 within the main range corresponds to the ratio of the collector region 4 to the buffer region 1b within the sense range being lower than the ratio of the collector region 4 within the main range.

In Embodiment 1, while the collector region 4 is disposed on the whole main region, the collector region 4 is selectively disposed on the sense range. That is, in Embodiment 1, a configuration is adopted in which a part of the collector region 4 in the sense range of the related semiconductor device (FIG. 1) is replaced with the buffer region 1b. Also, in the configuration adopted in Embodiment 1, in the range corresponding to the separation portion 5 on the lower surface of the semiconductor substrate 1, the buffer region 1b is disposed instead of the collector region 4.

Summary of Embodiment 1

Figure 5:
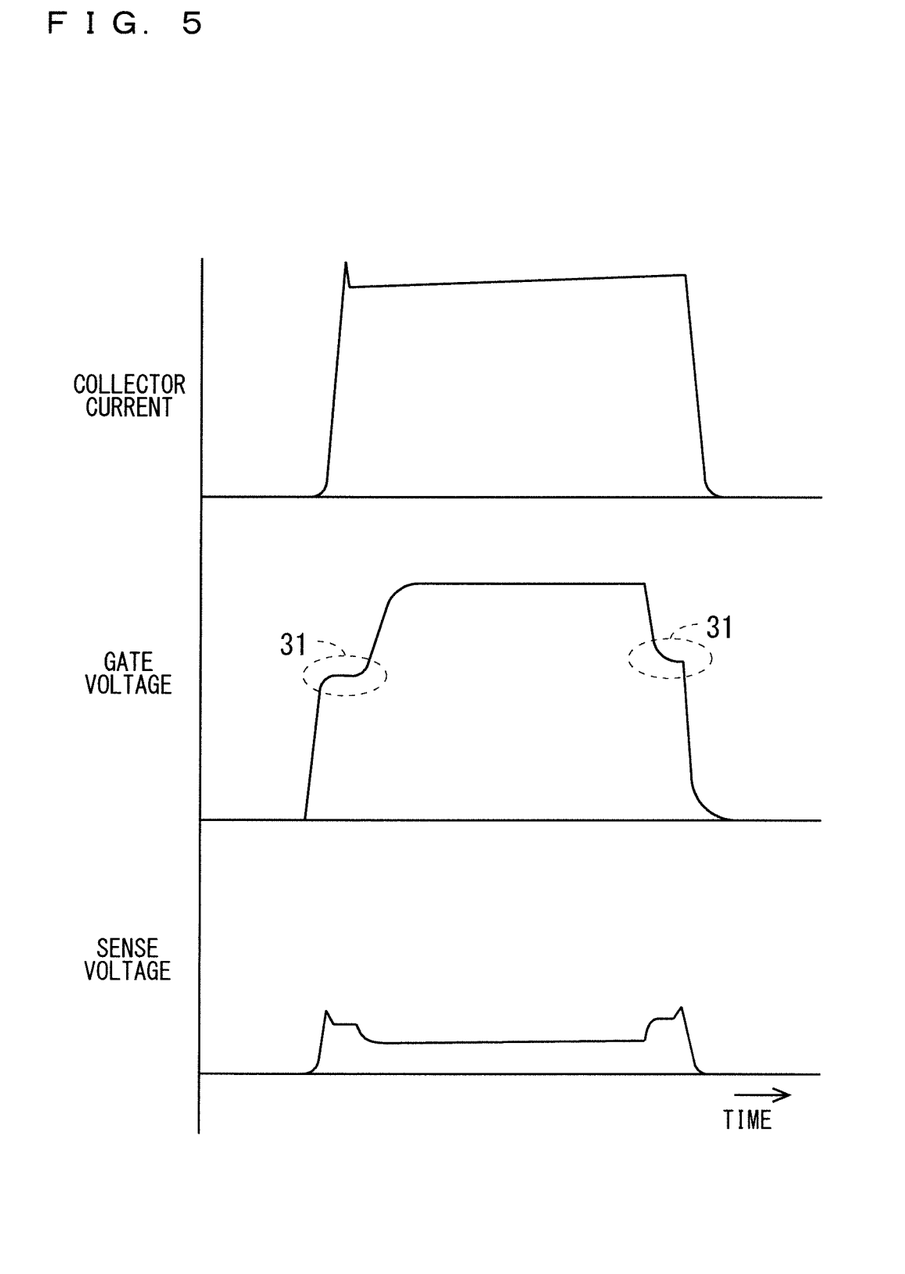
FIG. 5 A diagram illustrating respective changes in a collector current, a gate voltage, and a sense voltage at the time of switching of the semiconductor device according to Embodiment 1.

According to Embodiment 1 configured as described above, the area ratio of the collector region 4 within the sense range to the area of the sense range is lower than the area ratio of the collector region 4 within the main range to the area of the main range. According to such a configuration, in the sense-side IGBT, the smaller amount of holes is injected from the collector region 4 to the drift region 1a, so that the current capacity per unit area of the sense-side IGBT is made lower than the current capacity of the main-side IGBT. Therefore, as illustrated in FIG. 5, the suppression of the rise in the sense voltage when the collector voltage rises during the Miller plateau 31 is ensured.

Further, in the IGBT with a built-in current detection element having a relatively low on-voltage, even if the sense voltage is used for protection operations such as overcurrent protection and short-circuit current protection, the suppression of the occurrence of malfunction in a protection operation during the Miller plateau 31 is ensured. In addition, the filter or the like, which is used during the Miller plateau, is no longer required, or a filter with a small time constant, or the like, can be used; therefore, accurate protection operation is ensured in a wide region during switching is energized.

It is preferable to dispose the collector region 4 in the range directly below the channel of the sense-side IGBT in the sense range from the viewpoint of reducing the current capacity per unit area of the sense-side IGBT.

Modification of Embodiment 1

Figure 6:
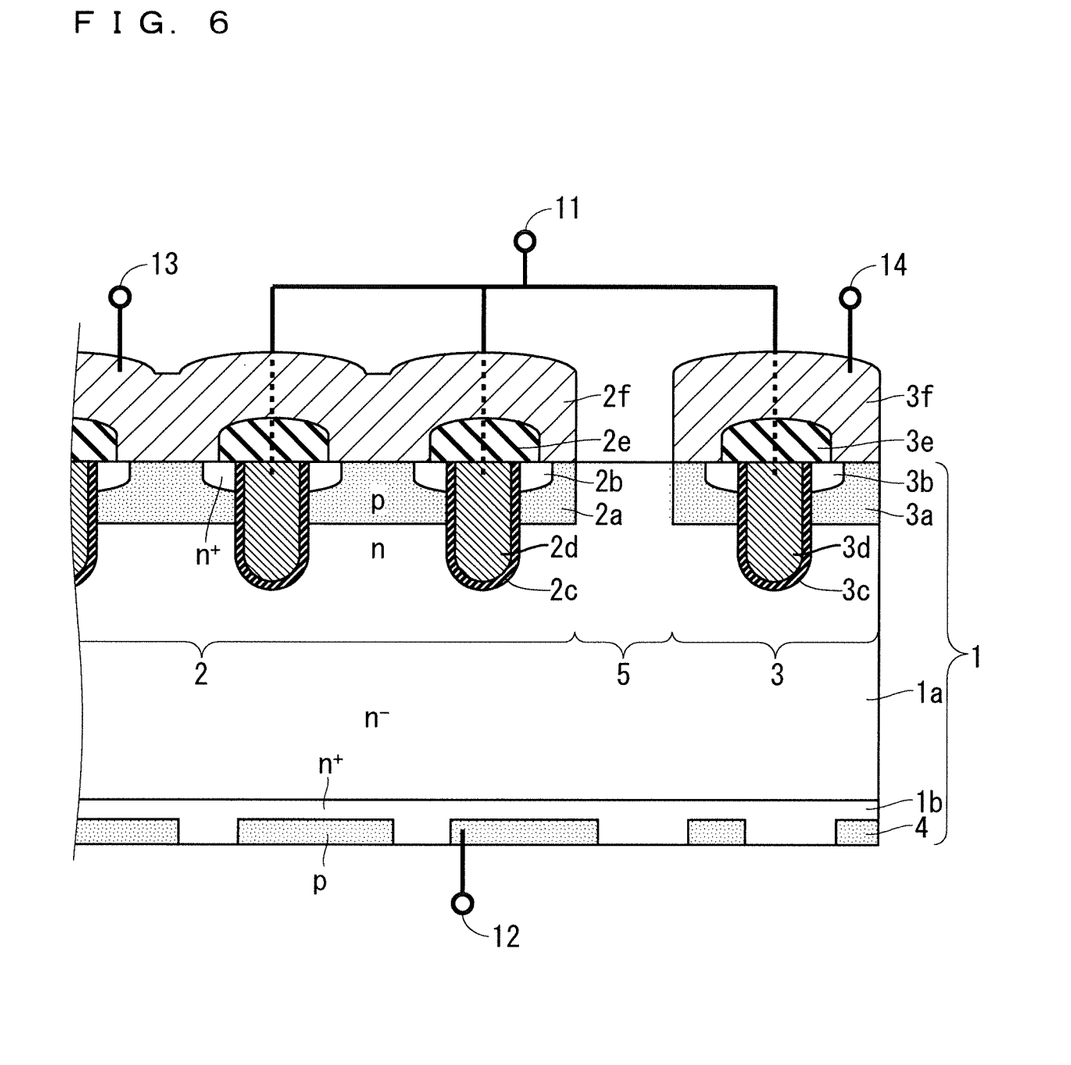
FIG. 6 A cross-sectional view illustrating a configuration of a semiconductor device according to Modification of Embodiment 1.

In Embodiment 1, although the collector region 4 is disposed on the whole main range and the collector region 4 is selectively disposed on the sense range, the configuration is not limited thereto. As long as the condition is satisfied in which the area ratio of the collector region 4 within the sense range to the area of the sense range is lower than the area ratio of the collector region 4 within the main range to the area of the main range, the collector region 4 may be selectively disposed in both the main range and the sense range. In this case, a reverse-conducting IGBT structure in which a diode is connected in parallel to the main-side IGBT is formed.

Even with such a configuration, the suppression of a malfunction of the protection operation during the Miller plateau 31 is ensured as in Embodiment 1. The manufacturing process of the reverse-conducting IGBT as in Modification originally includes the process of patterning and forming the collector region 4 or the buffer region 1b; therefore, the semiconductor device according to Modification can be formed without adding a special processing process.

Although in Embodiment 1, the main-side IGBT and the sense-side IGBT are trench gate type IGBTs, the present invention is not limited thereto. For example, the main-side IGBT and the sense-side IGBT may be planer gate type IGBTs. Above Modification is similarly applicable to Embodiment 2 described later.

Embodiment 2

Figure 7:
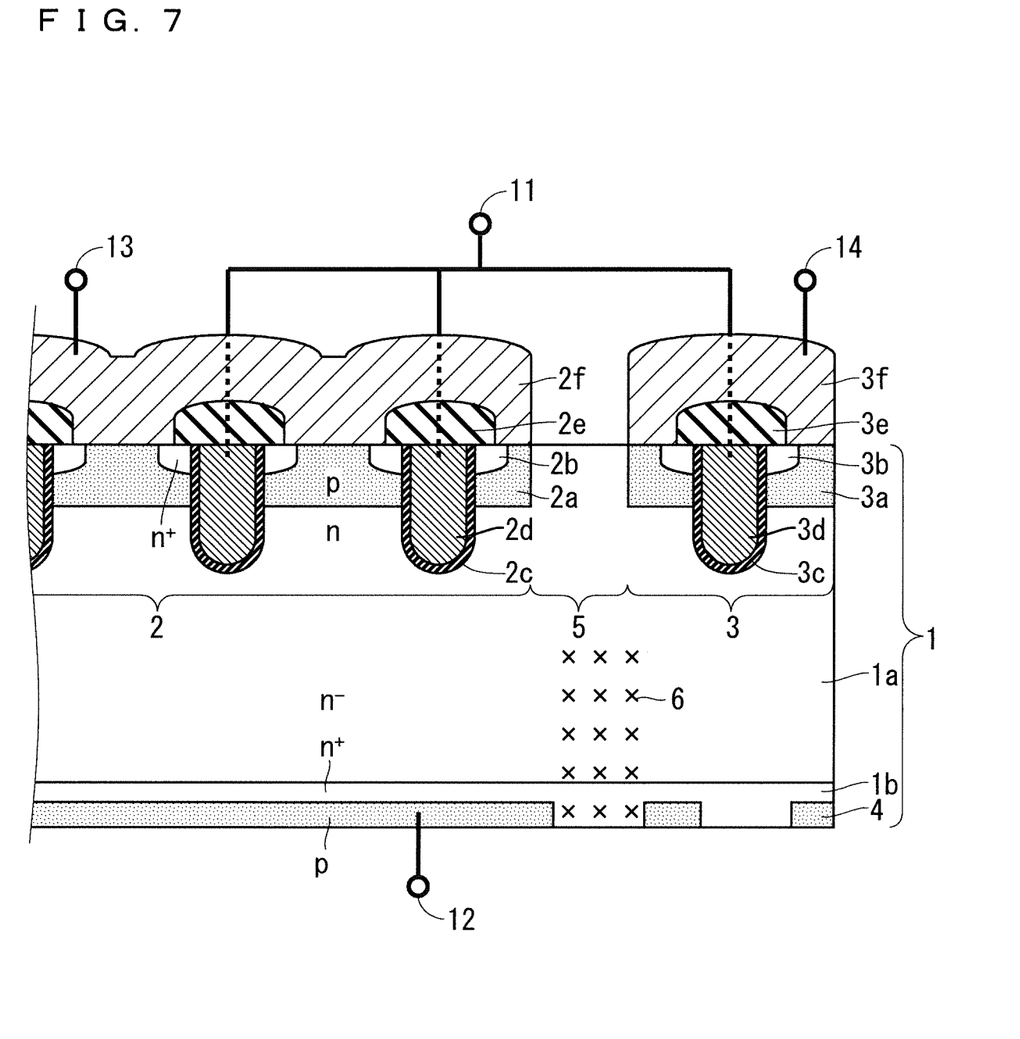
FIG. 7 A cross-sectional view illustrating a configuration of a semiconductor device according to Embodiment 2.

FIG. 7 is a cross-sectional view illustrating a configuration of a semiconductor device according to Embodiment 2 of the present invention. Hereinafter, of the components according to Embodiment 2, the same or similar reference numerals are given to the same or similar components as those described above, and different components will be mainly described.

The configuration of Embodiment 2 is the same as the configuration in which a carrier migration inhibition region 6 is added to the configuration of Embodiment 1. The carrier migration inhibition region 6 is disposed in a range corresponding to the separation portion 5 on the lower surface of the semiconductor substrate 1. In the example of FIG. 7, this range being a part of the buffer region 1b and the collector region 4 has a higher resistance to holes in the carrier migration inhibition region 6 than the resistance in the buffer region 1b and the collector region 4 other than the carrier migration inhibition region 6.

Here, in Embodiment 1, although depending on the size of the separation portion 5, the current capacity of the sense-side IGBT increases slightly when the holes from the collector region 4 in the main range flow into the sense-side IGBT.

Whereas, according to Embodiment 2 configured as described above, the carrier migration inhibition region 6 is provided at the interface between the main-side IGBT and the sense-side IGBT; therefore, the inflow of the holes from the collector region 4 of the main range into the sense-side IGBT is suppressed. Note, the carrier migration inhibition region 6 is favorably formed by injecting highly accelerated charged particles or the like from the lower surface side. When the carrier migration inhibition region 6 is formed in this manner, the above inflow of the holes can be suppressed while avoiding the influence of the characteristics on the surface element. Further, the larger the depth (length in the surface direction) from the lower surface of the carrier migration inhibition region 6, the more the effect of suppressing the inflow of the holes is enhanced.

Figure 8:
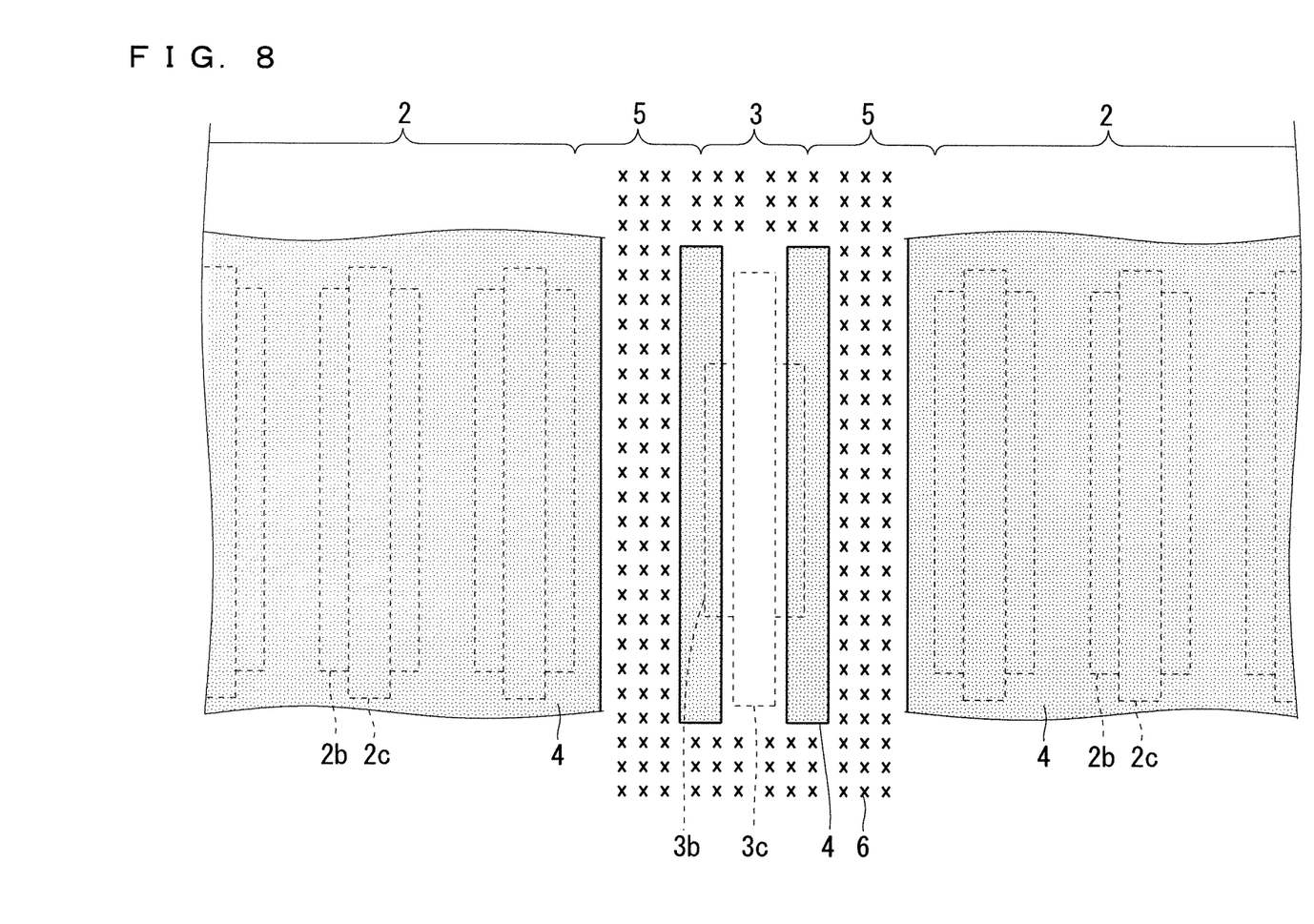
FIG. 8 A plan view illustrating a configuration of the semiconductor device according to Embodiment 2.

FIG. 8 is a plan view of an example of the semiconductor device according to Embodiment 2 as viewed from the collector region 4 side. As illustrate in FIG. 8, the carrier migration inhibition region 6 may be disposed so as to surround the sense range in plan view. With such a configuration, the effect of suppressing the inflow of the holes is enhanced.

It should be noted that Embodiments and Modification of the present invention can be arbitrarily combined and can be appropriately modified or omitted without departing from the scope of the invention.

While the invention has been described in detail, the forgoing description is in all aspects illustrative and not restrictive. It is understood that numerous other modifications and variations can be devised without departing from the scope of the invention.

EXPLANATION OF REFERENCE SIGNS

1 semiconductor substrate, 2 main IGBT portion, 3 sense IGBT portion, 4 collector region, 5 separation portion, 6 carrier migration inhibition region.

The invention claimed is:

1. A semiconductor device, comprising:
   a semiconductor substrate of first conductivity type;
   a first IGBT portion selectively disposed on a first main surface of the semiconductor substrate;
   a second IGBT portion disposed on the first main surface of the semiconductor substrate, spaced from the first IGBT portion, and used for detection of a current passing through the first IGBT portion; and
   an impurity region of second conductivity type selectively disposed on a second main surface opposite to the first main surface of the semiconductor substrate, wherein
   an area ratio of the impurity region within a second range to an area of the second range is lower than an area ratio of the impurity region within a first range to an area of the first range, the second range corresponding to the second IGBT portion on the second main surface, the first range corresponding to the first IGBT portion on the second main surface.

2. The semiconductor device according to claim 1, wherein
   the impurity region is disposed on the whole first range and is selectively disposed on the second range.

3. The semiconductor device according to claim 1, wherein
   the impurity region is selectively disposed on both the first range and the second range.

4. The semiconductor device according to claim 1, further comprising
   a carrier migration inhibition region disposed on a range of the second main surface of the semiconductor substrate, the range corresponding to a portion between the first IGBT portion and the second IGBT portion.

5. The semiconductor device according to claim 4, wherein
   the carrier migration inhibition region is disposed so as to surround the second range in plan view.

\* \* \* \* \*